United States Patent
Lee et al.

(10) Patent No.: US 8,232,166 B2
(45) Date of Patent: Jul. 31, 2012

(54) METHOD FOR FABRICATING SEMICONDUCTOR DEVICE WITH RECESS GATE

(75) Inventors: Seung-Mi Lee, Gyeonggi-do (KR); Yun-Hyuck Ji, Gyeonggi-do (KR); Tae-Kyun Kim, Gyeonggi-do (KR); Jin-Yul Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 169 days.

(21) Appl. No.: 12/614,543

(22) Filed: Nov. 9, 2009

(65) Prior Publication Data
US 2010/0258861 A1    Oct. 14, 2010

(30) Foreign Application Priority Data
Apr. 9, 2009 (KR) .................. 10-2009-0030918

(51) Int. Cl.
*H01L 21/336* (2006.01)
(52) U.S. Cl. ........ 438/270; 438/217; 438/255; 438/259; 438/297; 257/330; 257/E21.419; 257/333
(58) Field of Classification Search .............. 257/333; 438/217, 255, 259, 297, 270
See application file for complete search history.

(56) References Cited

U.S. PATENT DOCUMENTS

| 6,277,695 B1* | 8/2001 | Williams et al. .......... 438/268 |
| 2007/0123189 A1* | 5/2007 | Saito et al. .......... 455/333 |
| 2008/0135907 A1 | 6/2008 | Lin et al. |

FOREIGN PATENT DOCUMENTS

| KR | 1020050034292 | 4/2005 |
| KR | 1020050065152 | 6/2005 |
| KR | 1020080089099 | 10/2008 |

OTHER PUBLICATIONS

Notice of Preliminary Rejection issued from Korean Intellectual Property Office on Jan. 24, 2011.
Notice of Allowance issued from Korean Intellectual Property Office on Sep. 8, 2011.

* cited by examiner

*Primary Examiner* — Marcos D. Pizarro
*Assistant Examiner* — Eva Yan Montalvo
(74) *Attorney, Agent, or Firm* — IP & T Group LLP

(57) ABSTRACT

A semiconductor device includes a substrate with a recess pattern, a gate electrode filling the recess pattern, a threshold voltage adjusting layer formed in the substrate under the recess pattern, a source/drain region formed in the substrate on both sides of the gate electrode and a gate insulation layer, with the recess pattern being disposed between the gate electrode and the substrate, wherein the thickness of the gate insulation layer formed in a region adjacent to the source/drain region is greater than the thickness of the gate insulation layer formed in a region adjacent to the threshold voltage adjusting layer.

15 Claims, 6 Drawing Sheets

METHOD FOR FABRICATING SEMICONDUCTOR DEVICE WITH RECESS GATE

CROSS-REFERENCE(S) TO RELATED APPLICATIONS

The present application claims priority to Korean Patent Application No(s). 10-2009-0030918, filed on Apr. 9, 2009, the disclosure of which is incorporated herein by reference in its entirety.

BACKGROUND

The present application is directed to a semiconductor device, and more particularly, to a semiconductor device with a recess gate (RG) and a method for fabricating the same.

As the integration density of semiconductor devices increases, a channel area is getting smaller, while a doping concentration of an impurity region is getting higher. Thus, an existing planar gate (PG) has difficulty in obtaining characteristics required by high-integrated semiconductor devices, such as threshold voltage and refresh characteristics.

Therefore, to obtain the required threshold voltage and refresh characteristics, a semiconductor device with a recess gate (RG) has been introduced and applied. The recess gate has a three-dimensional channel structure because a gate electrode fills a recess pattern formed in a substrate.

FIG. 1 is a cross-sectional view of a conventional semiconductor device with a recess gate.

Referring to FIG. 1, the conventional semiconductor device with the recess gate includes a substrate 11 with a recess pattern 14, a threshold voltage adjusting layer 15 disposed in the substrate 11 under the recess pattern 14, a gate electrode 17 filling the recess pattern 14 and partially protruding over the substrate 11, gate spacers 20 disposed on both sidewalls of the gate electrode 17, a gate insulation layer 16 disposed between the substrate 11 and the gate electrode 17, and a source/drain region 21 disposed in the substrate 11 on both sides of the gate electrode 17. Also, the semiconductor device includes an isolation layer 12, an active region 13, a gate hard mask layer 18, and a gate 19.

However, as the design rule of a semiconductor device is reduced to 40 nm or less, a leakage current is increased by gate induced drain leakage (GIDL), causing rapid degradation of a refresh characteristic in a semiconductor device.

To solve the degradation of the refresh characteristic caused by GIDL, one proposed method increases a thickness T1 of a region adjacent to the source/drain region 21, that is, the gate insulation layer 16 formed on the sidewall of the recess pattern 14.

However, in case where the thickness T1 of the gate insulation layer 16 formed in a region adjacent to the source/drain region 21 is increased, a thickness of a region adjacent to the threshold voltage adjusting layer 15 (i.e., the gate insulation layer 16 formed on the bottom of the recess pattern 14), is also increased, causing degradation of a threshold voltage characteristic. This degradation is caused because the gate insulation layer 16 is formed using a thermal oxidation or a radical oxidation, and hence, the gate insulation layer 16 formed on the sidewall and bottom of the recess pattern 14 is formed with the same thickness (T1=T2).

Therefore, there is a need for a semiconductor device capable of preventing degradation of a refresh characteristic due to GIDL and obtaining a required threshold voltage characteristic, and a method for fabricating the same.

SUMMARY

Some embodiments are directed to providing a semiconductor device with a recess gate, which is capable of obtaining both a required threshold voltage characteristic and a required refresh characteristic, and a method for fabricating the same.

Some embodiments are directed to a semiconductor device, the semiconductor device comprising a substrate with a recess pattern, a gate electrode filling the recess pattern, a threshold voltage adjusting layer formed in the substrate under the recess pattern, a source/drain region formed in the substrate on both sides of the gate electrode and a gate insulation layer, with the recess pattern being disposed between the gate electrode and the substrate, wherein the thickness of the gate insulation layer formed in a region adjacent to the source/drain region is greater than the thickness of the gate insulation layer formed in a region adjacent to the threshold voltage adjusting layer.

The thickness of the gate insulation layer formed in the region adjacent to the threshold voltage adjusting layer is in a range of approximately 70% to approximately 80% of the thickness of the gate insulation layer formed in the region adjacent to the source/drain region.

The gate electrode has a structure filling a portion of the recess pattern, or a structure filling the recess pattern and partially protruding over the substrate.

The recess pattern can be any one type selected from the group consisting of a square type, a polygonal type, a bulb type, and a saddle fin type.

Some embodiments are directed to a method for fabricating a semiconductor device, the method comprising selectively etching a substrate to form a recess pattern, forming a gate insulating layer over the substrate with the recess pattern, wherein the thickness of the gate insulation layer formed on a sidewall of the recess pattern is greater than the thickness of the gate insulation layer formed on a bottom of the recess pattern, performing a plasma treatment on the gate insulation layer, forming a gate electrode over the gate insulation layer to fill the recess pattern, and forming a source/drain region in the substrate on both sides of the gate electrode.

The method further comprises, before forming the gate insulation layer, forming a threshold voltage adjusting layer in the substrate under the recess pattern.

The formation of the gate insulation layer and the plasma treatment are performed in-situ within a same chamber.

The thickness of the gate insulation layer formed on the bottom of the recess pattern is in a range of approximately 70% to approximately 80% of the thickness of the gate insulation layer formed in the sidewall of the recess pattern.

The gate insulation layer is formed using a mixed gas of tri-chloro-ethane (TCA, $C_2H_2Cl_3$) gas and oxygen ($O_2$) gas.

The method further comprises, before the plasma treatment, performing a purge process for removing the TCA gas remaining within the chamber after the gate insulation layer is formed.

The plasma treatment is performed using a mixed gas of hydrogen ($H_2$) gas and oxygen gas ($O_2$).

The method further comprises, before the plasma treatment, performing a purge process for removing the TCA gas remaining within the chamber after the gate insulation layer is formed.

The plasma treatment is performed at a lower pressure than the process of forming the gate insulation layer.

The gate insulation layer is formed at an atmospheric pressure of approximately 760 Torr.

The plasma treatment is performed at a pressure range of approximately 0.1 Torr to approximately 1 Torr.

The process of forming the gate insulation layer and the plasma treatment are performed at a same temperature.

The process of forming the gate insulation layer and the plasma treatment are performed in a temperature range of approximately 700° C. to approximately 900° C.

The gate electrode is formed in a structure filing a portion of the recess pattern, or a structure filling the recess pattern and partially protruding over the substrate.

The recess pattern is formed in any one type selected from the group consisting of a square type, a polygonal type, a bulb type, and a saddle fin type.

The substrate comprises a silicon substrate with a (100) surface orientation.

The plasma treatment is performed to remove impurities inside the gate insulation layer and densify layer quality of the gate insulation layer.

DESCRIPTION OF SPECIFIC EMBODIMENTS

Figure 1:
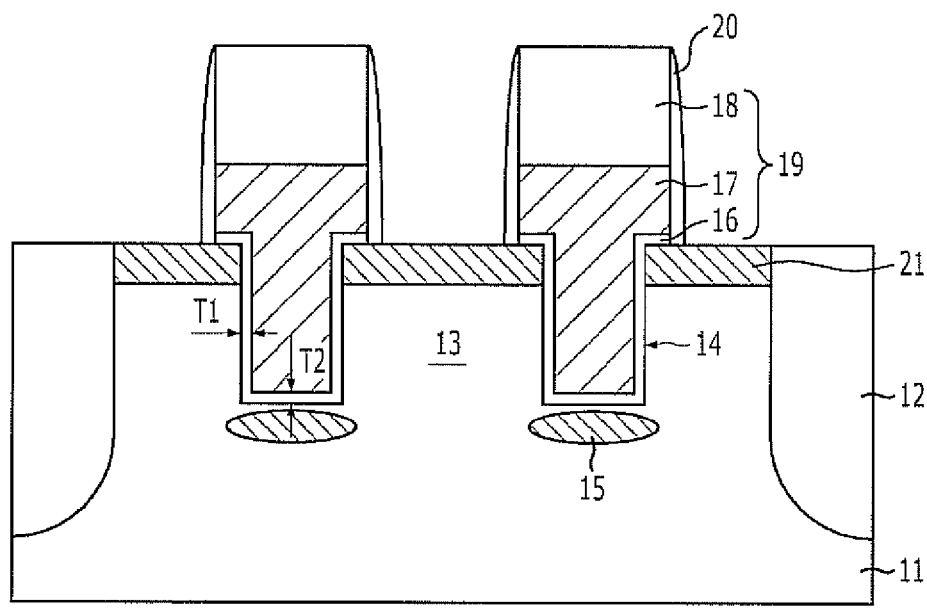
FIG. 1 is a cross-sectional view of a conventional semiconductor device with a recess gate.

Other objects and advantages of the present invention can be understood by the following description, and become apparent with reference to the embodiments described herein.

In the drawings, the illustrated thickness of layers and regions are exaggerated for clarity. When a first layer is referred to as being "on" a second layer or "on" a substrate, it could mean that the first layer is formed directly on the second layer or the substrate, or it could also mean that a third layer may exist between the first layer and the second layer or the substrate. Furthermore, the same or like reference numerals represent the same or like constituent elements, although they may appear in different embodiments and/or drawings.

The embodiments described herein relate to a semiconductor device capable of preventing degradation of a refresh characteristic due to GIDL and obtaining a required threshold voltage characteristic, and a method for fabricating the same. To this end, a region adjacent to a source/drain region (i.e., a gate insulation layer formed on a sidewall of a recess pattern), is formed thicker than a region adjacent to a threshold voltage adjusting layer (a gate insulation layer formed on the bottom of the recess pattern).

Figure 2:
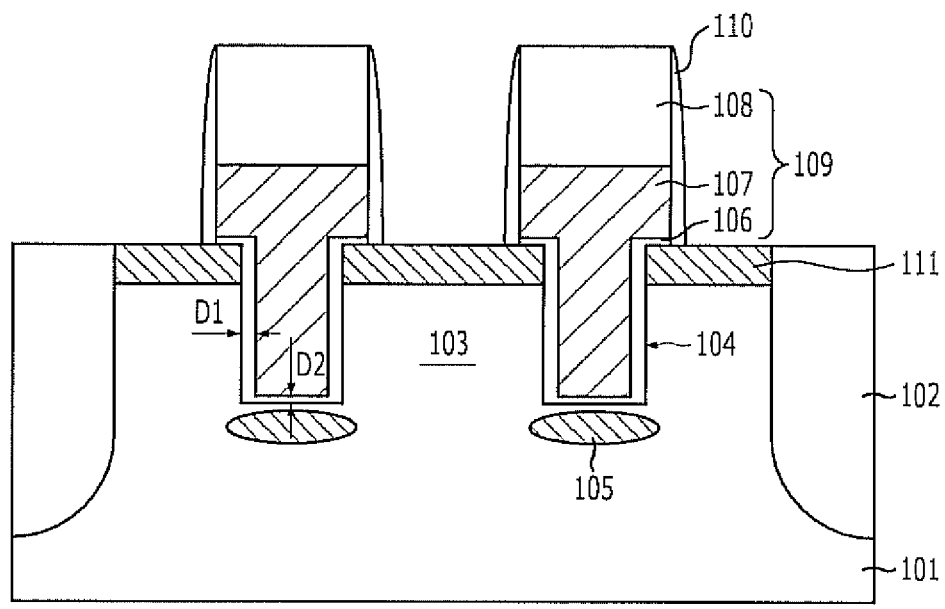
FIG. 2 is a cross-sectional view of a semiconductor device with a recess gate, in accordance with an embodiment.

FIG. 2 is a cross-sectional view of a semiconductor device with a recess gate in accordance with an embodiment.

Referring to FIG. 2, the semiconductor device in accordance with an embodiment described herein includes a substrate 101 with an active region 103 defined by an isolation layer 102, a recess pattern 104 disposed in the substrate 101, a gate electrode 107 filling the recess pattern 104, a gate hard mask layer 108 disposed over the gate electrode 107, gate spacers 110 disposed on both sidewalls of the gate electrode 107, a threshold voltage adjusting layer 105 disposed in the substrate 101 under the recess pattern 104, a source/drain region 111 disposed in the substrate 101 on both sides of the gate electrode 107, and a gate insulation layer 106 disposed between the gate electrode 107 and the substrate 101. In this case, a structure in which the gate insulation layer 106, the gate electrode 107, and the gate hard mask layer 108 are sequentially formed will be referred to as a gate 109.

A thickness D1 of the gate insulation layer 106 disposed in a region adjacent to the source/drain region 111 is greater than a thickness D2 of the gate insulation layer 106 disposed in a region adjacent to the threshold voltage adjusting layer 105 (D1>D2). That is, the thickness D1 of the gate insulation layer 106 disposed on the sidewall of the recess pattern 104 is greater than the thickness D2 of the gate insulation layer 106 disposed on the bottom of the recess pattern 104. In this case, the thickness D2 of the gate insulation layer disposed on the region adjacent to the threshold voltage adjusting layer 105 may be approximately 70% to approximately 80% of the thickness D1 of the gate insulation layer 106 disposed in the region adjacent to the source/drain region 111. Specifically, even though the thickness D1 of the gate insulation layer 106 formed on the sidewall of the recess pattern 104 adjacent to the source/drain region 111 increases in order to prevent increase of a leakage current caused by GIDL, degradation of a threshold voltage characteristic is prevented because the thickness D2 of the gate insulation layer 106 formed on the bottom of the recess pattern 104 adjacent to the threshold voltage adjusting layer 105 is relatively small.

More specifically, the thickness D1 of the gate insulation layer 106 formed in the region adjacent to the source/drain region 111 may be in a range of approximately 70 Å to approximately 90 Å in order to prevent or suppress occurrence of a leakage current caused by GIDL. Also, the thickness D2 of the gate insulation layer 106 formed in the region adjacent to the threshold voltage adjusting layer 105 may be in a range of approximately 50 Å to approximately 70 Å in order to obtain a threshold voltage characteristic required by a high-integrated semiconductor device.

Furthermore, the gate insulation layer 106 may be formed from an oxide layer, for example, a silicon oxide ($SiO_2$) layer, or may be formed of a nitrided silicon oxide layer in order that impurities contained in the gate electrode 107 are prevented from penetrating into the substrate 101.

The gate electrode 107 filling the recess pattern 104 may have a buried gate structure filling a portion of the recess pattern 104, or may have a structure filling the recess pattern 104 and partially protruding over the substrate 101, as illustrated in FIG. 2.

The isolation layer 102 may be formed by a shallow trench isolation (STI) process and may include an oxide layer. In this case, the isolation layer 102 may include a high-density plasma (HDP) layer, a spin-on dielectric (SOD) layer, or a stacked layer thereof.

The recess pattern 104 may be a line type in which it crosses both the isolation layer 102 and the active layer 103, or an island type in which it is formed only in the active region 103.

Moreover, the recess pattern 104 can be any one type selected from the group consisting of a polygonal type, a bulb type, and a saddle fin type, in addition to a square type illustrated in FIG. 2.

Figure 4:
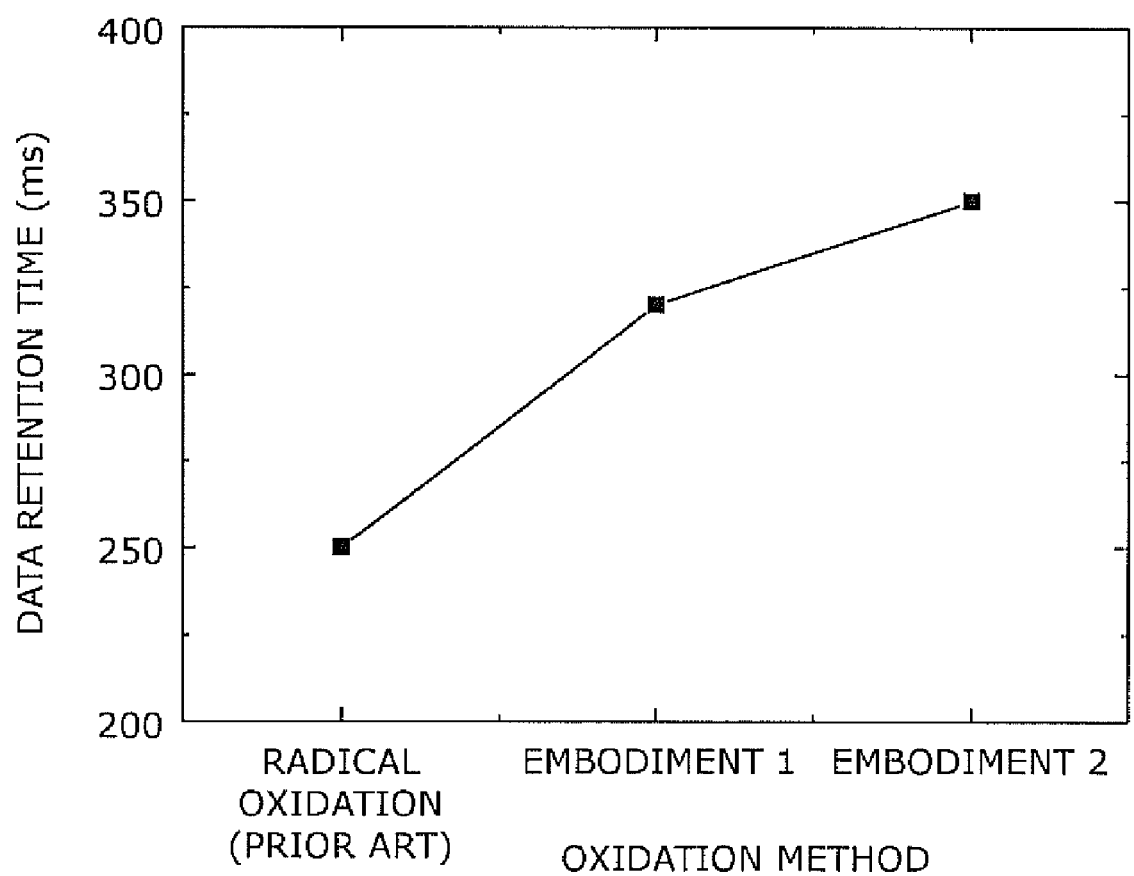
FIG. 4 is a graph showing the refresh characteristic of the semiconductor device with the recess gate, in accordance with an embodiment.
Figure 5:
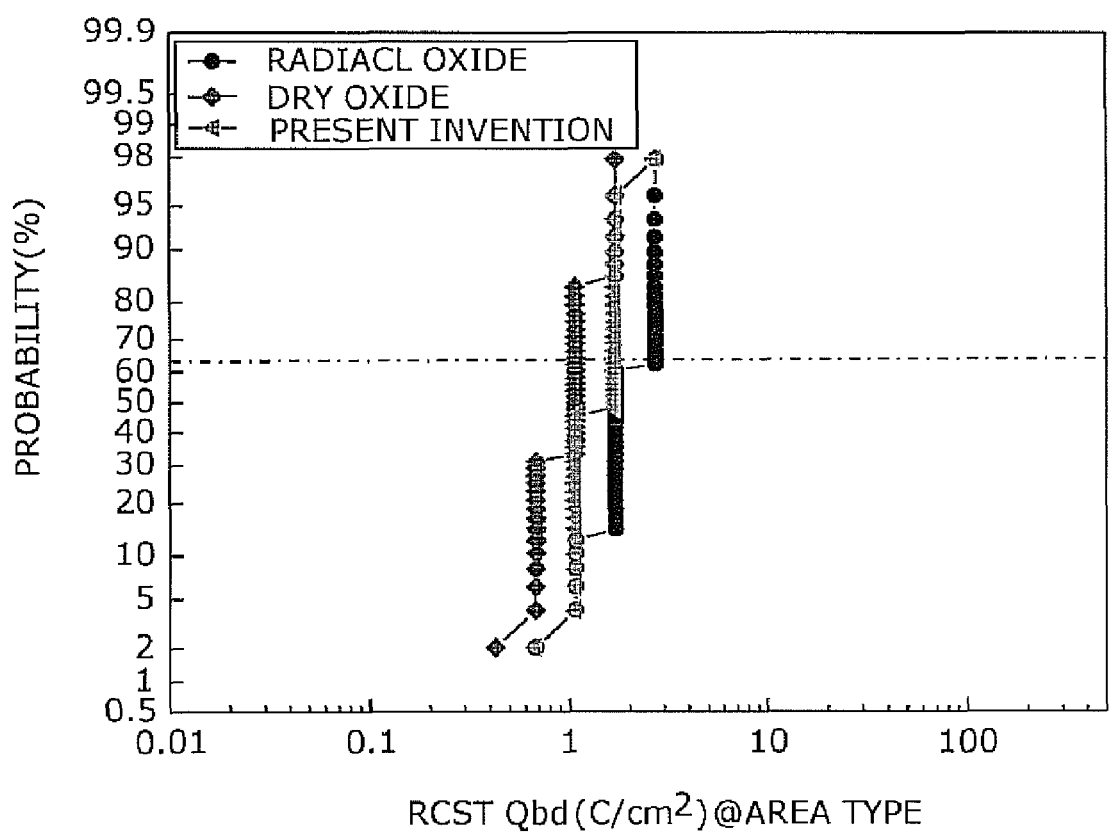
FIG. 5 is a graph showing the reliability of the gate insulation layer of the semiconductor device with the recess gate, in accordance with an embodiment.

As such, since the thickness D1 of the gate insulation layer 106 formed on the sidewall of the recess pattern 104 adjacent to the source/drain region 111 is greater than the thickness D2 of the gate insulation layer 106 formed on the bottom of the recess pattern 104 adjacent to the threshold voltage adjusting layer 105, the degradation of the refresh characteristic due to GIDL can be prevented and a required threshold voltage characteristic can be obtained (see FIGS. 4 and 5).

FIGS. 3A to 3E are cross-sectional views illustrating a method for fabricating a semiconductor device with a recess gate in accordance with an embodiment. Herein, a method for fabricating the semiconductor device illustrated in FIG. 2 will be described below.

Figure 3A:
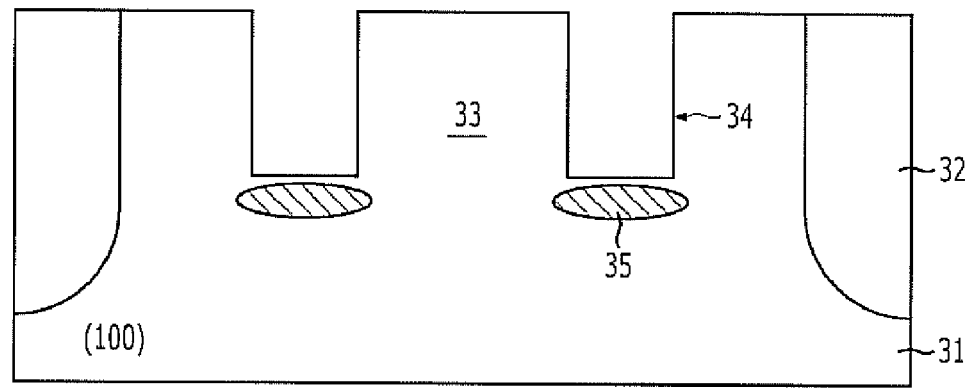
FIGS. 3A to 3E are cross-sectional views illustrating a method for fabricating a semiconductor device with a recess gate, in accordance with an embodiment.

Referring to FIG. 3A, a hard mask pattern (not shown) is formed over a substrate 31 with an active region 33 defined by an isolation layer 32. Using the hard mask pattern (not shown) as an etch barrier, the substrate 31 is etched to form a recess pattern 34. In this case, the recess pattern 34 may be any one type selected from the group consisting of a square type, a polygonal type, a bulb type, and a saddle fin type. Furthermore, the recess pattern 34 may be a line type in which it crosses both the isolation layer 32 and the active layer 33, or an island type in which it is formed only in the active region 33.

The substrate 31 may be a silicon substrate, or a silicon substrate with a (100) surface orientation for a subsequent formation of a gate insulation layer. For simplicity, the indication of the surface direction is omitted in the drawings.

The isolation layer 32 may be formed by an STI process and may include an oxide layer. In this case, the isolation layer 32 may include a high-density plasma (HDP) layer, a spin-on dielectric (SOD) layer, or a stacked layer thereof.

A channel implant is performed to form a threshold voltage adjusting layer 35 in the substrate 31. The threshold voltage adjusting layer 35 formed by the channel implant serves to obtain a threshold voltage characteristic of the semiconductor device. The threshold voltage adjusting layer 35 may be formed in the substrate 31 under the surface (that is, the sidewall and bottom) of the recess pattern 34, or may be formed only in the substrate 31 under the recess pattern 34 as illustrated in FIG. 3A.

The threshold voltage adjusting layer 35 formed by the channel implant may be formed only in the substrate 31 under the recess pattern 34, rather than in the substrate 31 under the surface of the recess pattern 34, in order to obtain both a threshold voltage characteristic and a refresh characteristic of the semiconductor device. The channel implant for forming the threshold voltage adjusting layer 35 in the substrate 31 under the bottom of the recess pattern 34 is called a local channel implant (LCI), and the threshold voltage adjusting layer 35 formed by the local channel implant may be formed by implanting impurity ions in a direction vertical to the substrate 31.

Figure 3B:
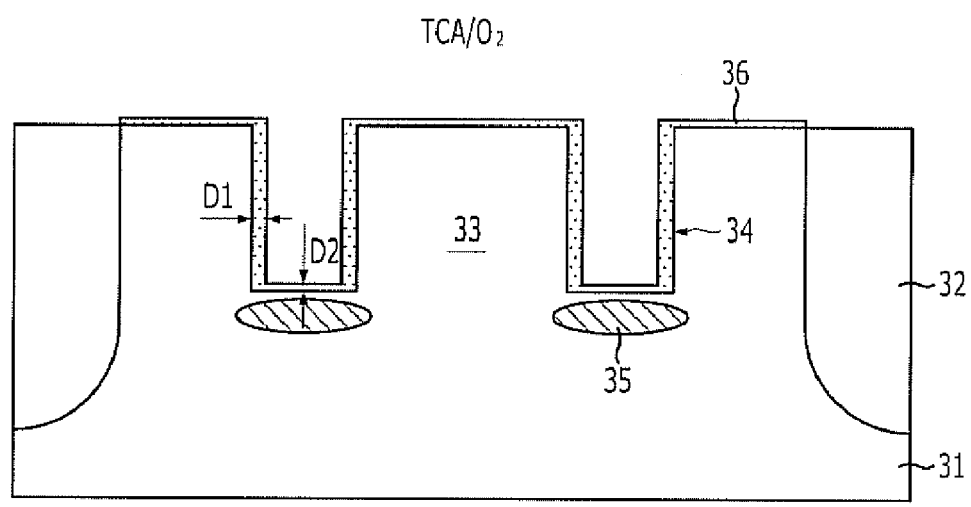

Referring to FIG. 3B, a gate insulation layer 36 is formed over the substrate 31 with the recess pattern 34. In this case, the gate insulation layer 36 may include an oxide layer, for example, a silicon oxide ($SiO_2$) layer.

To obtain both the required threshold voltage characteristic and the required refresh characteristic, the thickness D1 of the gate insulation layer 36 formed on the sidewall of the recess pattern 34 may be greater than the thickness D2 of the gate insulation layer 36 formed on the bottom of the recess pattern 34 (D1>D2). That is, the thickness D1 of the gate insulation layer 36 formed in a region adjacent to source/drain region, which will be formed in a subsequent process, is greater than the thickness D2 of the gate insulation layer 36 formed in a region adjacent to the threshold voltage adjusting layer 35.

In this case, the thickness D2 of the gate insulation layer 36 formed in the region adjacent to the threshold voltage adjusting layer 35, that is, on the bottom of the recess pattern 34, may be in a range of approximately 70% to approximately 80% of the thickness D1 of the gate insulation layer 36 formed on the sidewall of the recess pattern 34. That is, even though the thickness D1 of the gate insulation layer 36 formed on the sidewall of the recess pattern 34 adjacent to the source/drain region increases in order to prevent increase of a leakage current caused by GIDL, degradation of a threshold voltage characteristic is prevented (or effectively prevented) because the thickness D2 of the gate insulation layer 36 formed on the bottom of the recess pattern 34 adjacent to the threshold voltage adjusting layer 35 is relatively small.

The process of forming the gate insulation layer 36 will be described below in more detail.

The process of forming the gate insulation layer 36 may be performed using a mixed gas of tri-chloro-ethane (TCA: $C_2H_2Cl_3$) gas and oxygen ($O_2$) gas (i.e., TCA/$O_2$ in FIG. 3B) in order to form the gate insulation layer 36 with a different thickness at the sidewall and the bottom of the recess pattern 34. The mixed gas may have a ratio of the TCA gas to the oxygen gas of approximately 1:50. A flow rate of the TCA gas may in a range of approximately 0.1 standard liters per minute (slm) to approximately 10 slm, and a flow rate of the oxygen gas may be in a range of approximately 5 slm to approximately 500 slm. To prevent a chamber from being damaged by the TCA gas, the TCA gas mixed with the oxygen gas in a certain space may be supplied into the chamber.

The TCA gas adjusts the growth rate of the gate insulation layer 36 so that the gate insulation layer 36 is formed with a different thickness at the sidewall and the bottom of the recess pattern 34. The TCA gas can adjust the growth rate of a deposited thin film according to a crystal structure of the substrate 31, for example, a surface direction of the substrate 31. Therefore, since the surface directions of the bottom and the sidewall of the recess pattern 34 are different, the gate insulation layer 36 can be formed with a different thickness at the bottom and the sidewall of the recess pattern 34 by using the TCA gas. The oxygen gas is used as an oxidizing agent serving to oxidize the silicon substrate to form a silicon oxide layer.

Furthermore, the process of forming the gate insulation layer 36 may be performed at a high temperature, for example, in a temperature range of approximately 700° C. to approximately 900° C., and at an atmospheric pressure, that is, approximately 760 Torr. At this time, a region where a silicon bond is exposed in the substrate 31, for example, a silicon substrate, mutually reacts with the mixed gas (the TCA gas and the oxygen gas) to form the gate insulation layer 36 made of silicon oxide. Thus, as illustrated in FIG. 3B, the gate insulation layer 36 may be formed only on the surface of the active region 33.

A purge process is performed to remove the TCA gas remaining within the chamber. The purge process may be performed at the same temperature and pressure as the process of forming the gate insulation layer 36. A nitrogen ($N_2$) gas may be used as a purge gas. If the TCA gas remaining within the chamber is not removed after the process of forming the gate insulation layer 36 is completed, the chamber may be damaged or collided by the remaining TCA gas.

Figure 3C:
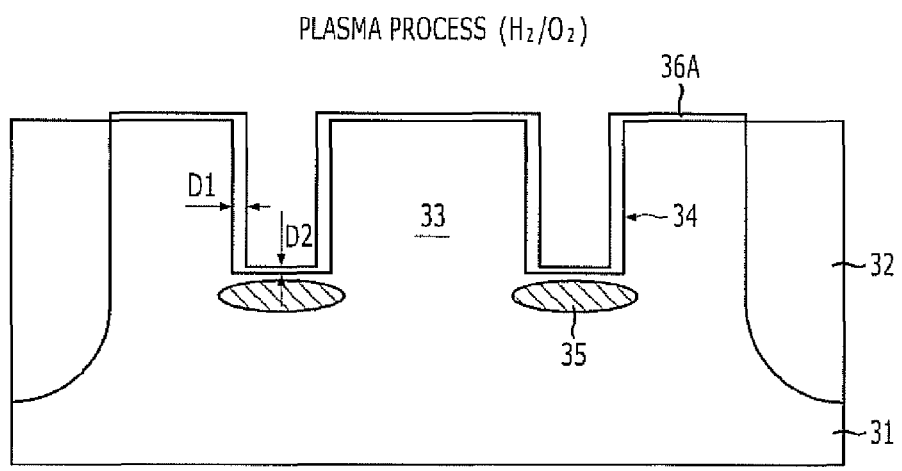

Referring to FIG. 3C, a plasma treatment is performed for removing impurities inside the gate insulation layer 36 and densifying the layer quality of the gate insulation layer 36. In this case, the plasma treatment is performed in-situ in the same chamber where the process of forming the gate insulation layer 36 has been performed. Hereinafter, the plasma-treated gate insulation layer 36 will be represented by a reference numeral "36A."

The plasma treatment for removing impurities inside the gate insulation layer 36A and densifying the layer quality of the gate insulation layer 36A will be described below in more detail.

Since the TCA gas is used for forming the gate insulation layer 36A with a different thickness at the bottom and the sidewall of the recess pattern 34, impurities such as carbon (C) and chlorine (Cl), which are derived from the TCA gas, may be contained in the gate insulation layer 36A. Furthermore, defects such as vacancy and dangling bond(s) may be formed within the gate insulation layer 36A. To remove the impurities and defects within the gate insulation layer 36A, the plasma treatment is performed in-situ in the same chamber where the process of forming the gate insulation layer 36 has been performed.

The plasma treatment may be performed at the same temperature as the process of forming the gate insulation layer 36, that is, in a temperature range of approximately 700° C. to approximately 900° C., and by using a mixed gas of hydrogen ($H_2$) gas and oxygen ($O_2$) gas. In this case, the mixed gas may have a ratio of the hydrogen gas to the oxygen gas of approximately 1:10. A flow rate of the hydrogen gas may be in a range of approximately 0.1 slm to approximately 10 slm, and a flow rate of the oxygen gas may be in a range of approximately 1 slm to approximately 100 slm.

Moreover, in order for smooth generation of plasma, the plasma treatment may be performed at a lower pressure than the process of forming the gate insulation layer 36, for example, in a pressure range of approximately 0.1 Torr to approximately 1 Torr.

A principle of removing the impurities inside the gate insulation layer 36A and densifying the layer quality of the gate insulation layer 36A through the plasma treatment is that active hydrogen ions and oxygen ions generated by the plasma are bonded with impurities inside the gate insulation layer 36, such as carbon and chlorine, to thereby generate nonvolatile gases such as hydrocarbon ($C_xH_y$, where x and y are natural numbers), carbon oxide ($C_xO_y$, where x and y are natural numbers), and hydrogen chloride ($H_xCl_y$, where x and y are natural numbers), and the generated nonvolatile gases remove impurities inside the gate insulation layer 36A through exhaust of gas to the outside of the chamber. Defects such as vacancy and dangling bond(s) inside the gate insulation layer 36A, and vacancy formed by detachment of impurities such as carbon and chlorine, are filled with active oxygen ions, thereby densifying the layer quality of the gate insulation layer 36A.

As described above, by removing the impurities inside the gate insulation layer 36A and densifying the layer quality of the gate insulation layer 36A through the plasma treatment, that is, improving the layer quality of the gate insulation layer 36A, the increase of a leakage current due to GIDL can be effectively prevented, thus further improving the refresh characteristic of the semiconductor device.

Meanwhile, since the plasma treatment is performed using oxygen gas at a high temperature environment, the thickness of the gate insulation layer 36A may increase. In this case, since the thickness increases uniformly over the gate insulation layer 36A, the thickness difference of the gate insulation layer 36A at the bottom and sidewall of the recess pattern 34 is not affected. Specifically, the thickness D1 of the gate insulation layer 36A formed on the sidewall of the recess pattern 34 through the above-described process (that is, when the plasma treatment is completed) may be in a range of approximately 70 Å to approximately 90 Å in order to prevent or suppress occurrence of a leakage current due to GIDL, and the thickness D2 of the gate insulation layer 36A formed on the bottom of the recess pattern 34 may be in a range of approximately 50 Å to approximately 70 Å in order to obtain a threshold voltage characteristic required by the high-integrated semiconductor device. In this case, the thickness of the gate insulation layer 36A increased during the plasma treatment may be approximately 20% to approximately 40% of the thickness of the gate insulation layer 36A when the plasma treatment is completed. That is, regarding the thickness of the gate insulation layer 36A formed on the bottom of the recess pattern 34, the thickness of the gate insulation layer 36A increased during the plasma treatment may be in a range of approximately 10 Å to approximately 30 Å, and the thickness of the gate insulation layer 36 formed prior to the plasma treatment may be in a range of approximately 20 Å to approximately 60 Å (see FIG. 4).

Figure 3D:
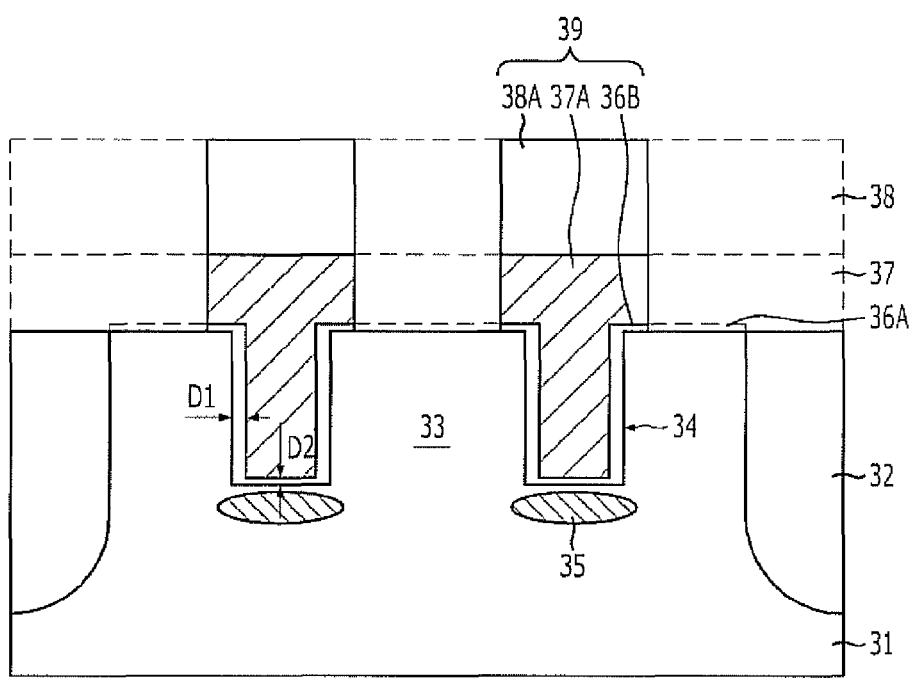

Referring to FIG. 3D, a gate conductive layer 37 filling the recess pattern 34 and covering the substrate 31 is formed over the gate insulation layer 36A, and a gate hard mask layer 38 is formed over the gate conductive layer 37. The gate conductive layer 37 may include a silicon layer, a metal layer, or a stacked layer thereof. Examples of the silicon layer include a polysilicon layer and a silicon germanium layer, and examples of the metal layer include a tungsten layer, a titanium layer, a titanium nitride layer, and a tungsten silicide layer. The gate hard mask layer 38 may be selected from the group consisting of an oxide layer, a nitride layer, an oxynitride layer, and a stacked layer thereof.

Meanwhile, prior to the formation of the gate conductive layer 37, a nitridation treatment may be performed in order to prevent any impurities contained in the gate conductive layer 37 from penetrating into the substrate 31 during the processes. The nitridation treatment may be performed at an atmosphere of a nitrogen-containing gas, for example, $N_2O$ gas or NO gas, by a furnace annealing process, or a rapid thermal process.

A photoresist pattern (not shown) is formed over the gate hard mask layer 38. Using the photoresist pattern (not shown) as an etch barrier, the gate hard mask layer 38, the gate conductive layer 37, and the gate insulation layer 36A are sequentially etched to form a gate 39. Hereinafter, the etched gate insulation layer 36A and the etched gate hard mask layer 38 are represented by a gate insulation part 36B and a gate hard mask 38A, respectively, and the etched gate conductive layer 37 is represented by a gate electrode 37A.

Meanwhile, the gate electrode 37A filling the recess pattern 34 over the gate insulation part 36B may be formed in a buried gate structure filling a portion of the recess pattern 34, or may be formed in a structure filling the recess pattern 34 and partially protruding over the substrate 31.

Figure 3E:
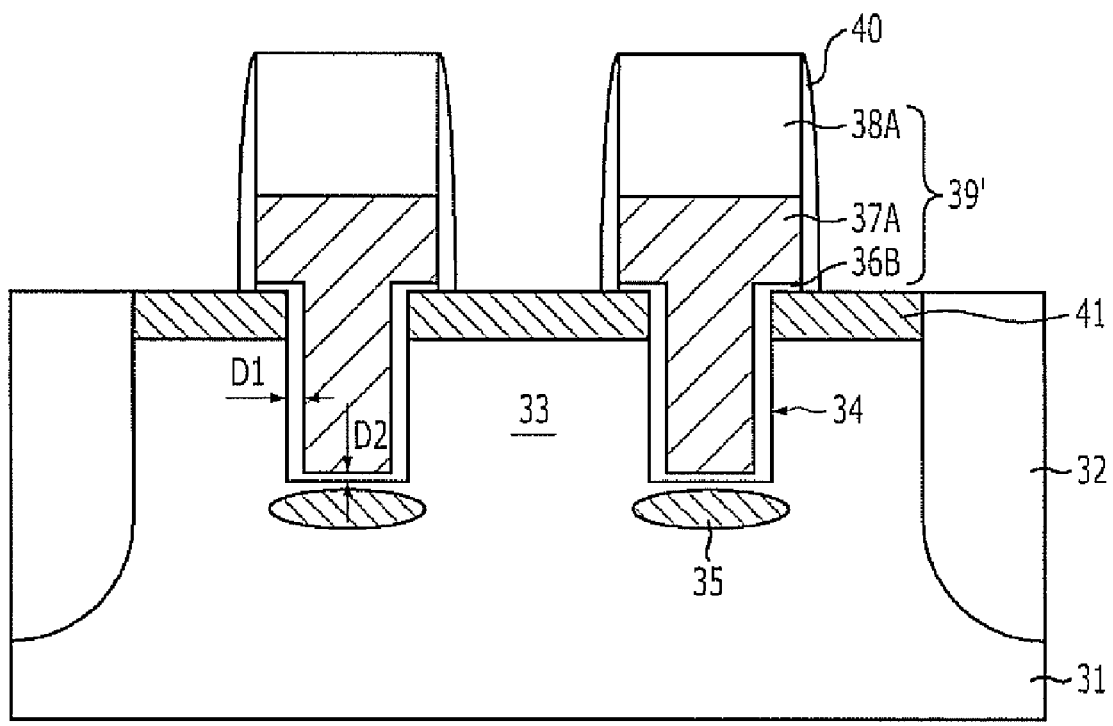

Referring to FIG. 3E, gate spacers 40 are formed on both sidewalls of the gate 39, thereby forming a gate 39'. A source/drain region 41 is formed by implanting impurity ions into the substrate 31 on both sides of the gate 39'. For convenience, the substrate where the source/drain region 41 is formed is also referred to as a substrate 31.

Through the above-described processes, the semiconductor device with the recess gate is completed.

As such, since the thickness D1 of the gate insulation layer 36B formed on the sidewall of the recess pattern 34 adjacent to the source/drain region 41 is greater than the thickness D2 of the gate insulation layer 36B formed on the bottom of the recess pattern 34 adjacent to the threshold voltage adjusting layer 35, the degradation of the refresh characteristic due to GIDL can be prevented and the required threshold voltage characteristic can be obtained (see FIGS. 4 and 5).

Moreover, by improving the layer quality of the gate insulation layer 36B through the plasma treatment, the degradation of the refresh characteristic due to GIDL can be prevented more effectively.

FIG. 4 is a graph showing the refresh characteristic of the semiconductor device with the recess gate, in accordance with an embodiment. Specifically, a data retention time characteristic is shown in FIG. 4.

In FIG. 4, the thickness of the gate insulation layer formed on the sidewall of the recess pattern is 70 Å. In FIG. 4, "prior art" represents a case where the gate insulation layer is formed using a radical oxidation, "embodiment 1" represents a case where the thickness of the gate insulation layer formed using TCA gas is 50 Å and the thickness of the gate insulation layer increased by the plasma treatment is 20 Å, and "embodiment 2" represents a case where the thickness of the gate insulation layer formed using TCA gas is 60 Å and the thickness of the gate insulation layer increased by the plasma treatment is 10 Å.

It can be seen from FIG. 4 that the data retention time characteristic of the gate insulation layer, in accordance with the embodiments described herein, is better (i.e., the data retention time is longer) than what is exhibited by the prior art. Furthermore, it can be seen that the data retention time characteristic increases (i.e., becomes better) as the thickness of the gate insulation layer formed using the TCA gas in the embodiments described herein increases along the x-axis in FIG. 4.

FIG. 5 is a graph showing the reliability of the gate insulation layer of the semiconductor device with the recess gate, in accordance with the embodiments described herein.

A ramped current stress time (RCST) test is a test to evaluate the reliability of the gate insulation layer. The RCST test measures time taken to cause breakdown of the gate insulation layer, or a breakdown probability per unit area by applying a current to a transistor stepwise. The point (dotted line) where the breakdown probability per unit area is approximately 60% is set as a mass production reference.

It can be seen from FIG. 5 that the gate insulation layer, formed in accordance with the embodiments described herein, meets the RCST mass production reference. Furthermore, it can be seen that the RCST characteristic of the gate insulation layer formed in accordance with the embodiments described herein is better (i.e., exhibits better probability of reliability) than the gate insulation layer formed by a dry oxidation process.

In accordance with the embodiments described herein, the thickness of the gate insulation layer formed on the bottom of the recess pattern adjacent to the threshold voltage adjusting layer is greater than the thickness of the gate insulation layer formed on the sidewall of the recess pattern adjacent to the source/drain region, thereby preventing the degradation of the refresh characteristic due to GIDL and obtaining the required threshold voltage characteristic.

Moreover, the layer quality of the gate insulation layer is improved through the plasma treatment, thereby effectively preventing the degradation of the refresh characteristic due to GIDL.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, the method comprising:
   selectively etching a substrate to form a recess pattern;
   forming a gate insulating layer over the substrate with the recess pattern, wherein the thickness of the gate insulation layer formed on a sidewall of the recess pattern is greater than the thickness of the gate insulation layer formed on a bottom of the recess pattern;
   performing a plasma treatment on the gate insulation layer;
   forming a gate electrode over the gate insulation layer to fill the recess pattern; and
   forming a source/drain region in the substrate on both sides of the gate electrode,
   wherein the plasma treatment is performed at a lower pressure than the process of forming the gate insulation layer.

2. The method of claim 1, further comprising, before forming the gate insulation layer, forming a threshold voltage adjusting layer in the substrate under the recess pattern.

3. The method of claim 1, wherein the formation of the gate insulation layer and the plasma treatment are performed in-situ within a same chamber.

4. The method of claim 1, wherein the thickness of the gate insulation layer formed on the bottom of the recess pattern is in a range of approximately 70% to approximately 80% of the thickness of the gate insulation layer formed on the sidewall of the recess pattern.

5. The method of claim 1, wherein the gate insulation layer is formed using a mixed gas of tri-chloro-ethane (TCA, $C_2H_2Cl_3$) gas and oxygen ($O_2$) gas.

6. The method of claim 5, further comprising, before the plasma treatment, performing a purge process for removing the TCA gas remaining within the chamber after the gate insulation layer is formed.

7. The method of claim 1, wherein the plasma treatment is performed using a mixed gas of hydrogen ($H_2$) gas and oxygen gas ($O_2$).

8. The method of claim 1, wherein the gate insulation layer is formed at an atmospheric pressure of approximately 760 Torr.

9. The method of claim 1, wherein the plasma treatment is performed at a pressure range of approximately 0.1 Torr to approximately 1 Torr.

10. The method of claim 1, wherein the process of forming the gate insulation layer and the plasma treatment are performed at a same temperature.

11. The method of claim 1, wherein the process of forming the gate insulation layer and the plasma treatment are performed in a temperature range of approximately 700° C. to approximately 900° C.

12. The method of claim 1, wherein the gate electrode is formed as a structure filling a portion of the recess pattern, or a structure filling the recess pattern and partially protruding over the substrate.

13. The method of claim 1, wherein the recess pattern is formed as any one type selected from the group consisting of a square type, a polygonal type, a bulb type, and a saddle fin type.

14. The method of claim 1, wherein the substrate comprises a silicon substrate with a surface orientation.

15. The method of claim 1, wherein the plasma treatment is performed to remove impurities inside the gate insulation layer and densify layer quality of the gate insulation layer.

* * * * *